United States Patent [19]
Hamburgen et al.

[11] Patent Number: 5,247,426
[45] Date of Patent: Sep. 21, 1993

[54] SEMICONDUCTOR HEAT REMOVAL APPARATUS WITH NON-UNIFORM CONDUCTANCE

[75] Inventors: William R. Hamburgen, Palo Alto; John S. Fitch, Newark, both of Calif.

[73] Assignee: Digital Equipment Corporation, Maynard, Mass.

[21] Appl. No.: 898,930

[22] Filed: Jun. 12, 1992

[51] Int. Cl.⁵ .............................................. H05K 7/20
[52] U.S. Cl. .................................. 361/705; 174/16.3; 257/712; 361/690; 361/717
[58] Field of Search ...................... 174/16.3; 165/80.3, 165/185; 357/80-81; 361/383, 386-389; 437/209

[56] References Cited

U.S. PATENT DOCUMENTS

| | | | |
|---|---|---|---|
| 4,884,630 | 12/1989 | Nelson | 361/385 |
| 4,966,226 | 10/1990 | Hamburgen . | |
| 4,995,451 | 2/1991 | Hamburgen . | |
| 5,083,373 | 1/1992 | Hamburgen . | |

OTHER PUBLICATIONS

Hamburgen, William; "Die Attach Structure and Method", Ser. No. 07/417,730; Filed Oct. 5, 1989.
Hamburgen, William; "Die Attach Structure and Method", Ser. No. 07/628,944; Filed Dec. 14, 1990.
Hamburgen, William; "Hollow Chip Package and Method of Manufacturing", Ser. No. 07/725,376; Filed Jun. 27, 1991.
Hamburgen, William; "Semiconductor Package and Method of Wraparound Metalization", Ser. No. 07/542,179, Filed Jun. 22, 1990.
Hamburgen, William et al.; "Fixture and Method for Attaching Components", Ser. No. 07/722,972; Filed Jun. 28, 1991.

*Primary Examiner*—Gregory D. Thompson
*Attorney, Agent, or Firm*—Flehr, Hohbach, Test, Albritton & Herbert

[57] ABSTRACT

An apparatus for removing heat from a semiconductor is disclosed. The apparatus is a non-uniform thermal conductance structure which includes high thermal conductance regions and low thermal conductance regions. The apparatus is coupled to the semiconductor in such a manner that the high power density, and thus high temperature, regions on the semiconductor are aligned with the high thermal conductance regions of the apparatus, and low power density, and thus low temperature, regions on the semiconductor are aligned with the low thermal conductance regions of the apparatus. As a result, a desirable temperature profile may be established across the surface of the semiconductor.

23 Claims, 3 Drawing Sheets

SEMICONDUCTOR HEAT REMOVAL APPARATUS WITH NON-UNIFORM CONDUCTANCE

BRIEF DESCRIPTION OF THE INVENTION

Generally, this invention relates to the removal of heat from the surface of a semiconductor. More particularly, this invention relates to a semiconductor heat removal apparatus which has non-uniform conductance to create a desirable temperature profile across the surface of the semiconductor.

BACKGROUND OF THE INVENTION

The power density of an integrated circuit is largely dependent upon the sizes of the circuit components. Thus, as integrated circuit component sizes diminish, power densities increase correspondingly, thereby creating heat dissipation problems which must be resolved. For example, in a mainframe computer, a 10×10 mm integrated circuit may dissipate 30W. This is equivalent to a heat flux of $3 \times 10^5$ W/m².

Most integrated circuits have non-uniform power consumption over the surface of the circuit. For instance, in a fully-integrated microprocessor the data path and clock circuits will typically have much higher watt densities than the cache memory circuits. This non-uniform power dissipation generates a corresponding temperature non-uniformity, or temperature gradient, over the surface of the circuit.

Heat transfer across a temperature gradient occurs by a phenomenon called conduction. At the microscopic level, conduction involves the transfer of energy from more energetic molecules to less energetic molecules. At the macroscopic level, conduction involves the transfer of heat from one part of a body at a higher temperature to another part of a body at a lower temperature.

The thermal characteristics of an integrated circuit may affect the operation of the device. That is, many physical properties of semiconductors depend upon temperature. For instance, logic speed, reference voltages, signal propagation delays, and switching thresholds are affected by local temperature conditions.

A variety of approaches exist for removing heat from a semiconductor. One typical approach is to use an adhesive to attach the semiconductor to a heat removal device such as a metallic heat sink or thermosiphon. Care must be exercised during the manufacturing process to insure that no gaps form in the adhesive. Gaps in the adhesive may result in the formation of local hot spots on the semiconductor which may seriously disrupt the semiconductor performance.

SUMMARY OF THE INVENTION

An apparatus for removing heat from a semiconductor is disclosed. The apparatus is a non-uniform thermal conductance structure which includes high thermal conductance regions and low thermal conductance regions. The apparatus is coupled to the semiconductor in such a manner that the high power density, and thus high temperature, regions on the semiconductor are aligned with the high thermal conductance regions of the apparatus, and low power density, and thus low temperature, regions on the semiconductor are aligned with the low thermal conductance regions of the apparatus. As a result, a desirable temperature profile may be established across the surface of the semiconductor.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
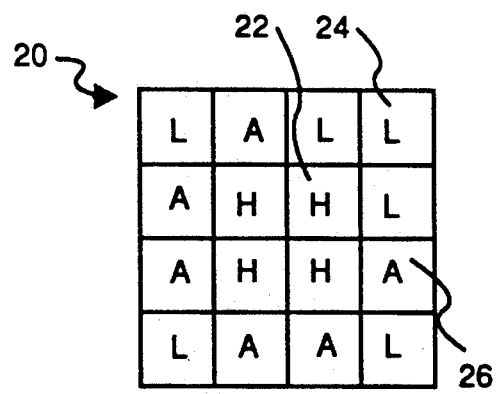
FIG. 1 is a plan view of a semiconductor which is characterized by regions with different local temperatures.

FIG. 1 is a plan view of a semiconductor 20. As with most semiconductors, the semiconductor 20 of FIG. 1 includes a number of regions of varying power consumption, and thus temperature. As used herein, a low temperature region corresponds to a low power consumption region of a semiconductor, while a high temperature region corresponds to a high power consumption region of the semiconductor. The semiconductor 20 of FIG. 1 includes a number of high temperature regions 22, a number of low temperature regions 24, and a number of average temperature regions 26.

In the prior art, semiconductor 20 is attached to its housing (not shown) or to a heat sink (not shown) with an adhesive. The prior art endeavors to evenly apply the adhesive over the surface of the semiconductor. If the adhesive is not evenly applied, local hot spots build up, potentially compromising the operation of the semiconductor. The evenly applied adhesive results in a uniform conductance over the surface of the semiconductor. In other words, the heat removal rate at the high temperature regions of the semiconductor is the same as the heat removal rate at the low temperature regions of the semiconductor. The uniform conductance of the prior art does not reduce the temperature variations over the surface of the semiconductor. That is, not enough heat is removed from the high temperature regions to eliminate local hot spots.

The present invention minimizes the significance of these prior art problems. In short, the present invention provides a non-uniform thermal conductance structure which is placed in contact with the semiconductor or which is formed within the semiconductor. The non-uniform thermal conductance structure includes high thermal conductance regions and low thermal conductance regions. The structure is aligned with the semiconductor in such a manner that the high temperature regions on the semiconductor correspond with the high thermal conductance regions of the structure, while the low temperature regions on the semiconductor correspond with the low thermal conductance regions of the structure. Consequently, heat is efficiently removed from the high temperature regions on the semiconductor. On the other hand, heat is not efficiently removed from the low temperature regions on the semiconductor. Consequently, the temperature in the low temperature regions increases. Thus, the efficient heat removal from the high temperature regions and the inefficient heat removal from the low temperature regions results in an improved temperature distribution across the surface of the semiconductor.

As will be disclosed below, there are many ways of achieving non-uniform conductance. However, all techniques share a common characteristic: in some planar section between the semiconductor and the heat removal surface, at least two materials of different thermal conductivity are distributed to control the flow of the heat. The materials can be solids, fluids or a combination of solids and fluids. The materials can be integrated into either the semiconductor or the heatsink, or the materials can be arranged between the semiconductor and the heatsink.

Figure 2:
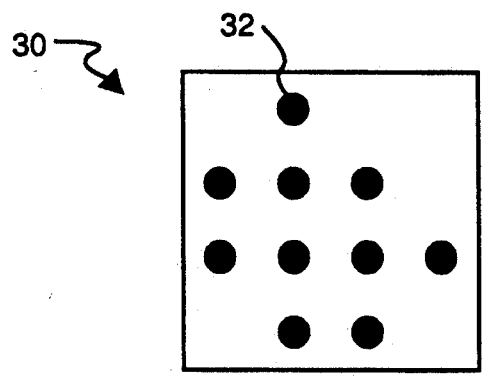
FIG. 2 is a plan view of a patterned adhesive embodiment of the non-uniform conductance semiconductor heat removal apparatus of the invention.
Figure 3:
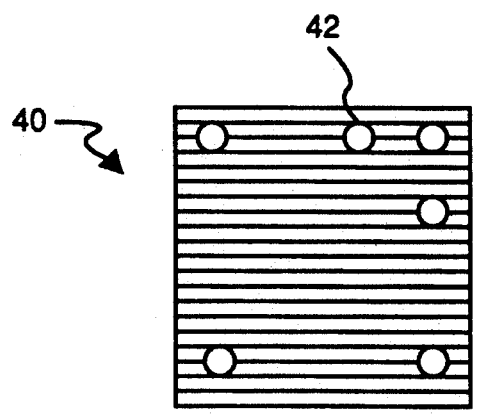
FIG. 3 is a plan view of an alternate patterned adhesive embodiment of the non-uniform conductance semiconductor heat removal apparatus of the invention.

FIGS. 2 and 3 depict "adhesive pattern" embodiments of the invention. FIG. 2 depicts a substrate 30 which may be either the backside of a semiconductor or a heat sink which is attached to the semiconductor. The substrate 30 includes a number of paste segments 32. In a "patterned paste" embodiment as shown in FIG. 2, the paste segments 32 are positioned to correspond to the high temperature regions 22 and average temperature regions 26 of the semiconductor 20 of FIG. 1. Consequently, a high thermal conductance is achieved at these locations. In contrast, a low thermal conductance results at the low temperature regions 24 since no paste segments 32 are available to remove heat from the semiconductor.

FIG. 2 may also represent a "multi-material paste" embodiment of the invention. In particular, the paste segments 32 may be formed of pastes of varying conductivity. For instance, the paste segments corresponding to the higher temperature regions of the semiconductor may have a high thermal conductance factor, while the paste segments corresponding to the average temperature regions may have a lower thermal conductance factor.

The paste segments 32 may be formed of any thermally conductive epoxy, such as silver, ceramic, or glass microsphere filled epoxy. One skilled in the art may select an appropriate paste from the thermal conductance information provided by paste manufacturers. The paste segments may be dispensed onto the substrate 30 with a point-by-point program controlled syringe. In the alternative, the paste segments may be dispensed by gang or pattern techniques, screening methods, pin transfer methods, or other techniques.

FIG. 3 depicts another adhesive pattern embodiment of the invention in the form of either a "perforated film" or a "multi-material film". In this embodiment, a film 40 is used, such as a commercially available silver filled epoxy adhesive. Perforations 42 are provided in the film to create a non-uniform thermal conductance structure. In other words, perforations 42 are provided to generate low thermal conductance regions which are aligned with the low temperature regions of the semiconductor. The depicted "perforations" 42 in FIG. 3 may actually be another film material in accordance with a "multi-material film" embodiment of the invention. For instance, a film material of a lower conductivity may be positioned in the perforation regions 42. A "multi-material film" embodiment of the invention may also include a paste dispensed within the perforated regions of the film 40.

Figure 4:
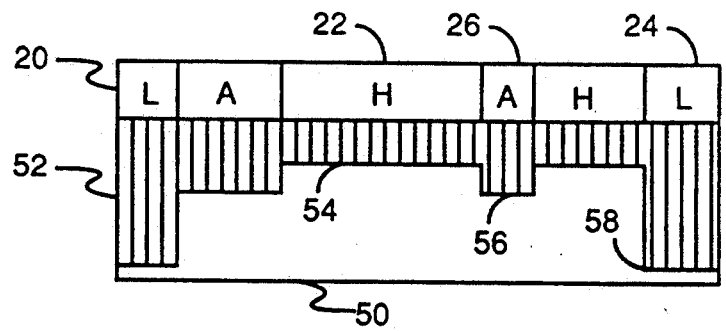
FIG. 4 is a side view of a non-uniform adhesive profile embodiment of the non-uniform conductance semiconductor heat removal apparatus of the invention.
Figure 5:
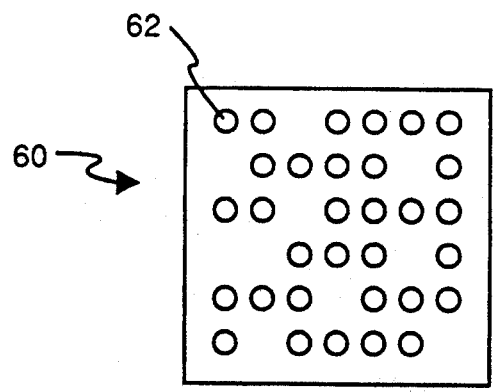
FIG. 5 is a plan view of a binary profile embodiment of the non-uniform conductance semiconductor heat removal apparatus of the invention.
Figure 6:
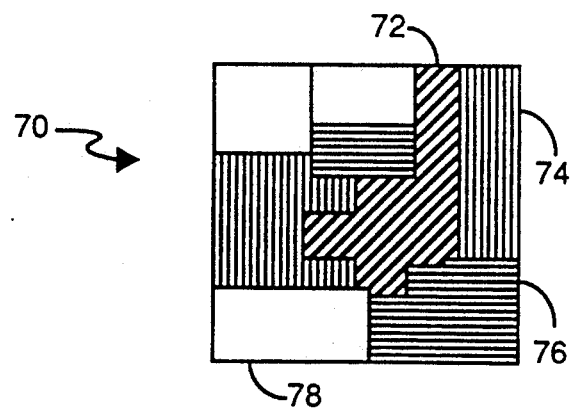
FIG. 6 is a plan view of a sub-surface profile embodiment of the non-uniform conductance semiconductor heat removal apparatus of the invention.

FIGS. 4 through 6 depict various "adhesive profile" embodiments of the present invention. FIG. 4 is a side view of a semiconductor 20 which includes, high temperature regions 22, low temperature regions 24, and average temperature regions 26. It should be appreciated that the heat is generated on the non-attached surface of the semiconductor 20, opposite the adhesive 52. The semiconductor 20 is coupled to a substrate 50 by an adhesive 52. The substrate 50 includes a "trench profile" which creates a corresponding trench profile for the adhesive 52. The trench profile includes an upper plateau 54, and middle plateau 56, and a lower plateau 58.

As reflected in FIG. 4, the adhesive 52 is relatively thick beneath low temperature regions and relatively thin beneath high temperature regions. Consequently, heat removal from the high temperature regions is efficient. The thick adhesive beneath the low temperature regions impairs heat flow. This results in heat from the low temperature regions being forced toward the high temperature regions for a better thermal distribution over the surface of the semiconductor.

The trenched substrate 50 may be formed by subtractive methods such as milling, drilling, or etching to create the various plateaus (54, 56, and 58). Alternately, the trenched substrate 50 may be formed by additive methods to build up the plateaus from a flat surface. The trench profile may also be formed at the base of the semiconductor.

Another embodiment of the adhesive profile structure of the invention is the "binary profile" as depicted in FIG. 5. FIG. 5 displays a substrate 60. Again, the substrate 60 may be the semiconductor itself or a surface to which the semiconductor is attached. In this embodiment, a number of orifices 62 are drilled into the substrate 60. Each orifice is deep enough so that a cavity will still exist after an adhesive is applied over the substrate and its orifices. The cavity serves as a thermal "open circuit" suitable for positioning beneath low temperature regions of the semiconductor. Each orifice will be relatively deep, but the precise depth is not important, as is in the embodiment of FIG. 4. This approach simplifies the manufacturing process since depth control is not critical.

FIG. 6 depicts a "sub-surface profile" embodiment of the present invention. In this embodiment, the substrate 70 includes a number of areas with discrete thermal conductances. As used herein, "sub-surface" refers to either the surface of the substrate, or the surface of the substrate and the region beneath the surface which effects the thermal conductance of the surface.

The substrate 70 of FIG. 6 includes a number of "sub-surfaces" with discrete thermal conductances. For example, the diagonally stripped area 72 may be of a first thermal conductance, the vertically stripped area 74 may be of a second thermal conductance, the horizontally stripped area 76 may be of a third thermal conductance, and white area 78 may be of a fourth thermal conductance 78. The variations in thermal conductivity of the sub-surfaces may be achieved by any of a variety of techniques. For instance, annealing or other crystallographic methods may be used, trace elements may be removed or introduced in the sub-surface region to vary the thermal conductivity. Laser, electron, or ion beams may also be used to alter the thermal conductivity of the sub-surfaces of the substrate.

Figure 7:
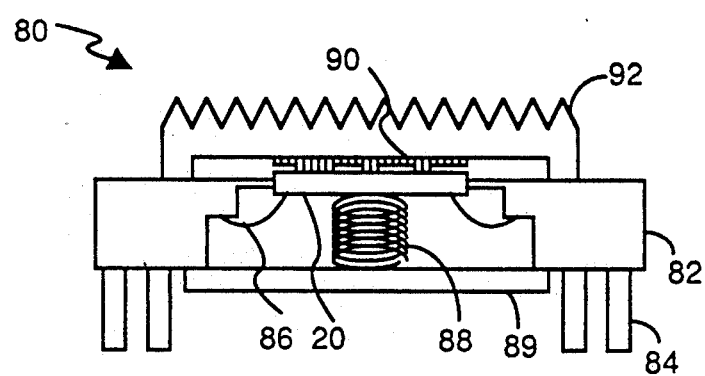
FIG. 7 is a side view of a pressure contact embodiment of the non-uniform conductance semiconductor heat removal apparatus of the invention.

Turning now to FIG. 7, a "pressure contact" embodiment of the invention is disclosed. In particular, a package 80 is depicted. The package includes a semiconductor housing 82 with a number of external pins 84 for connection to a circuit board (not shown). In this embodiment, a semiconductor 20 is positioned in the housing 82. The semiconductor 20 may be coupled to the housing by bond wires 86. An elastomer device 88, held in place by lid 89, impinges a force on the semiconductor 20. On the opposite side of the semiconductor 20, a pressure contact structure 90 is placed in contact with the semiconductor 20. In this embodiment, the pressure contact structure 90 is attached to a heatsink 92. Thus, the pressure contact structure 90 is directly applied to the semiconductor 20. FIG. 7 depicts the pressure contact structure in the form of a trenched profile, as previously discussed in relation to FIG. 4. However, the pressure contact structure 90 may also be in the form of a binary profile, as previously discussed in relation to FIG. 5, or the pressure contact structure 90 may be in the form of a sub-surface profile, as previously discussed in relation to FIG. 6. The pressure contact structure 90 may include a heat removal fluid which moves across the profile surface.

One skilled in the art will recognize the numerous advantages associated with the present invention. First, the non-uniform conductance structure results in improved temperature uniformity across the entire surface of the semiconductor. This feature reduces the intensity of local hot spots which might otherwise disrupt the operation of the semiconductor. The greater temperature uniformity afforded by the present invention facilitates a semiconductor attachment with reduced joint stress. Furthermore, non-uniform stress profiles may be designed into the assembly by creating appropriate thermal conductance patterns.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

We claim:

1. An apparatus, comprising:
   a semiconductor which includes a plurality of local high watt density regions and a plurality of local low watt density regions; and
   a patterned adhesive non-uniform thermal conductance structure including high thermal conductance regions and low thermal conductance regions, said patterned adhesive non-uniform thermal conductance structure being coupled to said semiconductor such that said high watt density regions on said semiconductor are aligned with said high thermal conductance regions and said low watt density regions on said semiconductor are aligned with said low thermal conductance regions, so as to create a desirable watt density profile across the surface of said semiconductor.

2. The apparatus of claim 1 wherein said patterned adhesive non-uniform thermal conductance structure is a patterned paste, said patterned paste including thermally conductive paste in predetermined locations.

3. The apparatus of claim 1 wherein said patterned adhesive non-uniform thermal conductance structure is a multi-material paste, said multi-material paste including a first paste with a first thermal conductance and a second paste with a second thermal conductance.

4. The apparatus of claim 1 wherein said patterned adhesive non-uniform thermal conductance structure is a perforated film, said perforated film including an adhesive film with perforations at predetermined locations.

5. The apparatus of claim 1 wherein said patterned adhesive non-uniform thermal conductance structure is multi-material film, said multi-material film including an adhesive film with a first thermal conductance and predetermined regions within said adhesive film including a second adhesive film with a second thermal conductance.

6. The apparatus of claim 1 wherein said patterned adhesive non-uniform thermal conductance structure is a multi-material film, said multimaterial film including an adhesive film with a first thermal conductance and predetermined regions within said adhesive film including a paste with a second thermal conductance.

7. An apparatus, comprising:
   a semiconductor which includes an active component surface producing a plurality of local high watt density regions and a plurality of local low watt density regions throughout said semiconductor; and
   an adhesive profile non-uniform thermal conductance structure including high thermal conductance regions and low thermal conductance regions, said adhesive profile non-uniform thermal conductance structure being formed within a surface opposite said component surface of said semiconductor such that said high watt density regions on said semiconductor are aligned with said high thermal conductance regions and said low watt density regions on said semiconductor are aligned with said low thermal conductance regions, so as to create a desirable temperature profile across the surface of said semiconductor.

8. The apparatus of claim 7 wherein said adhesive profile non-uniform thermal conductance structure is a trench profile, said trench profile including a plurality of plateaus with discrete vertical heights.

9. The apparatus of claim 7 wherein said adhesive profile non-uniform thermal conductance structure is a binary profile, said binary profile including a plurality of orifices at predetermined locations.

10. The apparatus of claim 7 wherein said adhesive profile non-uniform thermal conductance structure is a sub-surface profile, said sub-surface profile including surface or sub-surface regions of said non-uniform thermal conductance structure with discrete thermal conductivities.

11. An apparatus, comprising:

a semiconductor which includes a plurality of local high watt density regions and a plurality of local low watt density regions; and a patterned adhesive variably thermal conducting structure applied to said semiconductor and including a set of first thermal conductance areas for removing heat from said plurality of local low watt density regions at a first heat conductance rate; and a set of second thermal conductance areas for removing heat from said plurality of local high watt density regions at a second heat conductance rate greater than said first heat conductance rate, so as to create a desirable temperature profile across the surface of said semiconductor.

12. The apparatus of claim 11 wherein said patterned adhesive variably thermal conducting structure is a patterned paste, said patterned paste including thermally conductive paste in predetermined locations.

13. The apparatus of claim 11 wherein said patterned adhesive variably thermal conducting structure is a multi-material paste, said multi-material paste including a first paste with a first thermal conductance and a second paste with a second thermal conductance.

14. The apparatus of claim 11 wherein said patterned adhesive variably thermal conducting structure is a perforated film, said perforated film including an adhesive film with perforations at predetermined locations.

15. The apparatus of claim 11 wherein said patterned adhesive variably thermal conducting structure is multi-material film, said multi-material film including an adhesive film with a first thermal conductance and predetermined regions within said adhesive film including a second adhesive film with a second thermal conductance.

16. The apparatus of claim 11 wherein said patterned adhesive variably thermal conducting structure is a multi-material film, said multimaterial film including an adhesive film with a first thermal conductance and predetermined regions within said adhesive film including a paste with a second thermal conductance.

17. An apparatus, comprising:

a semiconductor which includes an active surface generating a plurality of local high watt density regions and a plurality of local low watt density regions throughout said semiconductor; and an adhesive profile variably thermal conducting structure formed within a surface opposite said active surface, and including a set of first thermal conductance areas for removing heat from said plurality of local low watt density regions at a first heat conductance rate; and a set of second thermal conductance areas for removing heat from said plurality of local high watt density regions at a second heat conductance rate greater than said first heat conductance rate, so as to create a desirable temperature profile across the surface of said semiconductor.

18. The apparatus of claim 17 wherein said adhesive profile variably thermal conducting structure is a trench profile, said trench profile including a plurality of plateaus with discrete vertical heights.

19. The apparatus of claim 17 wherein said adhesive profile variably thermal conducting structure is a binary profile, said binary profile including a plurality of orifices at predetermined locations.

20. The apparatus of claim 17 wherein said adhesive profile variably thermal conducting structure is a sub-surface profile, said sub-surface profile including surface or sub-surface regions of said non-uniform thermal conductance structure with discrete thermal conductivities.

21. An apparatus, comprising:

a semiconductor which includes a plurality of local high watt density regions and a plurality of local low watt density regions; and a pressure contact non-uniform thermal conductance structure coupled to said semiconductor, said pressure contact non-uniform thermal conductance structure including a trench profile with a plurality of adhesive plateaus with discrete vertical heights forming high thermal conductance regions and low thermal conductance regions, said pressure contact non-uniform thermal conductance structure being coupled to said semiconductor such that said high watt density regions on said semiconductor are aligned with said high thermal conductance regions and said low watt density regions on said semiconductor are aligned with said low thermal conductance regions, so as to create a desirable temperature profile across the surface of said semiconductor.

22. An apparatus, comprising:

a semiconductor which includes a plurality of local high watt density regions and a plurality of local low watt density regions; and a pressure contact non-uniform thermal conductance structure coupled to said semiconductor, said pressure contact non-uniform thermal conductance structure including a binary profile with a plurality of substantially uniform orifices at predetermined locations forming high thermal conductance regions and low thermal conductance regions, said pressure contact non-uniform thermal conductance structure being coupled to said semiconductor such that said high watt density regions on said semiconductor are aligned with said high thermal conductance regions and said low watt density regions on said semiconductor are aligned with said low thermal conductance regions, so as to create a desirable temperature profile across the surface of said semiconductor.

23. An apparatus, comprising:

a semiconductor which includes a plurality of local high watt density regions and a plurality of local low watt density regions; and a pressure contact non-uniform thermal conductance structure coupled to said semiconductor, said pressure contact non-uniform thermal conductance structure including a substrate with uniform physical dimensions and a sub-surface profile forming high thermal conductance regions and low thermal conductance regions, said pressure contact non-uniform thermal conductance structure being coupled to said semiconductor such that said high watt density regions on said semiconductor are aligned with said high thermal conductance regions and said low watt density regions on said semiconductor are aligned with said low thermal conductance regions, so as to create a desirable temperature profile across the surface of said semiconductor.

* * * * *